(12) United States Patent
Kushiya et al.

(10) Patent No.: US 7,977,139 B2
(45) Date of Patent: Jul. 12, 2011

(54) METHOD FOR MANUFACTURING CIS BASED THIN FILM SOLAR CELL DEVICE

(75) Inventors: Katsumi Kushiya, Tokyo (JP); Yousuke Fujiwara, Tokyo (JP)

(73) Assignee: Showa Shell Sekiyu K.K., Tokyo (JP)

( * ) Notice: Subject to any disclaimer, the term of this patent is extended or adjusted under 35 U.S.C. 154(b) by 4 days.

(21) Appl. No.: 12/593,032

(22) PCT Filed: Mar. 28, 2007

(86) PCT No.: PCT/JP2007/056623
§ 371 (c)(1),
(2), (4) Date: Sep. 25, 2009

(87) PCT Pub. No.: WO2008/120306
PCT Pub. Date: Oct. 9, 2008

(65) Prior Publication Data
US 2010/0047958 A1  Feb. 25, 2010

(51) Int. Cl.
*H01L 21/20* (2006.01)
(52) U.S. Cl. .......... 438/57; 438/84; 438/94; 257/E21.09
(58) Field of Classification Search .................... 438/57, 438/84–86, 93–98
See application file for complete search history.

(56) References Cited

U.S. PATENT DOCUMENTS

| | | | | |
|---|---|---|---|---|
| 5,981,868 A | * | 11/1999 | Kushiya et al. | 136/262 |
| 6,040,521 A | * | 3/2000 | Kushiya et al. | 136/265 |
| 6,537,845 B1 | * | 3/2003 | McCandless et al. | 438/93 |
| 7,700,161 B2 | * | 4/2010 | Oladeji | 427/455 |
| 2005/0236032 A1 | * | 10/2005 | Aoki | 136/252 |
| 2009/0032109 A1 | * | 2/2009 | Kushiya | 136/264 |
| 2009/0194150 A1 | * | 8/2009 | Aoki | 136/252 |
| 2009/0235987 A1 | * | 9/2009 | Akhtar et al. | 136/262 |
| 2010/0087027 A1 | * | 4/2010 | Wieting | 438/61 |
| 2010/0096004 A1 | * | 4/2010 | Hu et al. | 136/256 |

FOREIGN PATENT DOCUMENTS

| | | |
|---|---|---|
| JP | 08-330614 | 12/1996 |
| JP | 10-074966 | 3/1998 |
| JP | 11-145493 | 5/1999 |
| JP | 3249342 | 11/2001 |
| JP | 3311286 | 5/2002 |
| JP | 2002-343987 | 11/2002 |
| JP | 2004-327849 | 11/2004 |
| JP | 2006-295035 | 10/2006 |

OTHER PUBLICATIONS

International Search Report for PCT Patent App. No. PCT/JP2007/056623 (May 15, 2007).

* cited by examiner

*Primary Examiner* — Savitri Mulpuri
(74) *Attorney, Agent, or Firm* — Cermak Nakajima LLP; Tomoko Nakajima

(57) ABSTRACT

Before a buffer layer deposition step P5, a pre-rinse step P4 is provided to remove deposits deposited on the surface of a CIS-based light absorbing layer 3D. Thus, the disturbing factors of the formation reaction of the buffer layer are removed, thereby to improve the coverage of the buffer layer, and to hold the transparency thereof. In addition, a rinse step P6 is provided after the step P5. Thus, the colloidal solid matter remaining on the buffer layer surface is cleaned and removed with a rinse solution, thereby to hold the high resistivity. The rinse solution from a second rinse tank of the step P6 is re-used. After the step P6, a draining/drying step P7 is provided. After drying, an n-type window layer (transparent conductive film) is deposited.

20 Claims, 3 Drawing Sheets

METHOD FOR MANUFACTURING CIS BASED THIN FILM SOLAR CELL DEVICE

This application is a national phase entry under 35 U.S.C. §371 of PCT Patent Application No. PCT/JP2007/056623, filed on Mar. 28, 2007, which is incorporated by reference.

TECHNICAL FIELD

The present invention relates to a method for manufacturing a CIS-based thin-film solar cell device.

BACKGROUND ART

As for the buffer layer of a CIS-based thin-film solar cell device, and a manufacturing method thereof, there are known Patent Documents 1, 2 and 3 proposed by the present applicant. For example, in Patent Document 1, it is disclosed that the buffer layer of the CIS-based thin-film solar cell device is formed of a zinc mixed crystal compound semiconductor thin film, and that a part of hydroxides in the zinc mixed crystal compound semiconductor thin film have been reformed into oxides. As the method for depositing the zinc mixed crystal compound semiconductor thin film, there is disclosed the following method: a zinc salt and a sulfur-containing salt are mixed with an appropriate complex forming agent, so that a zinc ammonia complex salt is formed in a solution containing a zinc salt and a sulfur-containing salt dissolved therein; a first multinary compound semiconductor thin film to serve as a light absorbing layer is brought in contact therewith in the solution, so that a zinc mixed crystal compound semiconductor thin film containing oxygen, sulfur, and a hydroxy group is grown from the solution on the first multinary compound semiconductor thin film; then, the first multinary compound semiconductor thin film on which the zinc mixed crystal compound semiconductor thin film has been grown is annealed in air, thereby to reform a part of hydroxides in the zinc mixed crystal compound into oxides; and resultantly, a high-resistance zinc mixed crystal compound containing oxygen, sulfur, and hydroxyl group is produced.

Whereas, Patent Document 2 discloses as follows: on a first multinary compound semiconductor thin film to serve as a light absorbing layer, a zinc mixed crystal compound semiconductor thin film to serve as a buffer layer (interface layer) is chemically grown from a strongly alkaline solution mixture; the strongly alkaline solution mixture is a solution obtained by mixing a solution of a zinc salt dissolved in an aqueous ammonia or an ammonium hydroxide solution with an aqueous solution of a sulfur-containing salt dissolved in pure water; and the zinc mixed crystal compound semiconductor thin film is deposited with the transparency of the solution mixture being within the range of 100% to 50%.

Further, Patent Document 3 discloses as follows: on a first multinary compound semiconductor thin film to serve as a light absorbing layer, the sulfur-containing zinc mixed crystal compound semiconductor thin film is chemically grown from a solution; then, the sulfur-containing zinc mixed crystal compound semiconductor thin film is annealed in vacuum of 1 to 100 Torr at a temperature of 100 to less than 250° C. for 10 to 120 minutes, thereby to convert zinc hydroxide in the sulfur-containing zinc mixed crystal compound semiconductor thin film into zinc oxide; and resultantly, a buffer layer (interface layer) which is transparent and has high resistance is formed.

Patent Document 1: Japanese Patent No. 3249342 (JP-A-8-330614)

Patent Document 2: Japanese Patent No. 3311286 (JP-A-11-145493)

Patent Document 3: JP-A-2002-343987

In such a buffer layer or a CIS-based thin-film solar cell device manufactured by a deposition method of the buffer layer, generally, in the deposition step of a CIS-based light absorbing layer, deposits of simple substances such as sulfur and selenium, compounds thereof, and the like are deposited on the surface of the CIS-based light absorbing layer. Further, colloidal solid matter is also deposited on the surface of the buffer layer during the buffer layer deposition. In this respect, when it is possible to remove the deposits at the junction of the CIS-based light absorbing layer and the buffer layer, and to remove the deposits on the buffer layer surface, conceivably, the high resistance at the buffer layer-covered part can be held, and the conversion efficiency of the CIS-based thin-film solar cell device can be improved. However, such a technology has not yet been disclosed.

DISCLOSURE OF THE INVENTION

Problems that the Invention is to Solve

Under such circumstances, it is an object of the present invention to remove the deposits deposited on the surfaces of the CIS-based light absorbing layer and the buffer layer, and thereby to prevent the buffer layer from being unable to cover the low resistance semimetal phase of the light absorbing layer surface, and to hold the transparency and the high resistance at the buffer layer-covered part, and thereby to improve FF (fill-factor) and $E_{ff}$ (conversion efficiency) which are the solar cell characteristics of the CIS-based thin-film solar cell device.

Further, it is another object of the present invention to re-use the cleaning solution for use in the cleaning step of removing the deposits, and thereby to reduce the manufacturing cost of the device.

Means for Solving the Problems

Under such circumstances, in order to achieve the foregoing objects, a method for manufacturing a CIS-based thin-film solar cell device in accordance with one aspect of the present invention includes has a pn heterojunction of a substrate structure in which, on a substrate, a metal back electrode layer, a CIS-based light absorbing layer (a first multinary compound semiconductor thin film) having a p-type conductivity type, an n-type buffer layer, and an n-type window layer (a transparent conductive film) having an opposite conductivity type from that of the CIS-based light absorbing layer, and having a conductivity are successively stacked, characterized by including: a first pre-rinse step of cleaning and removing deposits deposited on the surface of the CIS-based light absorbing layer with a pre-rinse solution before the buffer layer deposition step.

Further, it is also acceptable that the pre-rinse solution has been heated to generally the same temperature as the temperature of a buffer layer growth tank.

Still further, it is also acceptable that, as the pre-rinse solution, any of pure water, aqueous ammonia, or lower amine solution is used.

Furthermore, it is also acceptable that, in the pre-rinse step, air or a nitrogen gas is bubbled in the pre-rinse solution.

Whereas, it is also acceptable that the method includes a second pre-rinse step of rinsing the substrate surface with a pre-rinse solution.

Further, it is also acceptable that the method includes a step of removing the deposits from the used pre-rinse solution used in the first or second pre-rinse step through a filter, followed by re-use as a pre-rinse solution.

Still further, it is also acceptable that the method includes: a step of filtrating the pre-rinse solution used in the first or second pre-rinse step, and discharged as liquid waste through a filter, wherein the filtrated pre-rinse solution is used as pure water for preparation of a chemical liquid for growing the buffer layer.

Furthermore, a method for manufacturing a CIS-based thin-film solar cell device in accordance with another aspect of the invention is a method for manufacturing a CIS-based thin-film solar cell device which includes a pn heterojunction of a substrate structure including, on a substrate, a metal back electrode layer, a CIS-based light absorbing layer (first multinary compound semiconductor thin film) having a p-type conductivity type, an n-type buffer layer, and an n-type window layer (transparent conductive film) having an opposite conductivity type from that of the CIS-based light absorbing layer, and having a conductivity are successively stacked, characterized by including: a first rinse step of cleaning and removing colloidal solid matter formed and deposited on the surface of the buffer layer during buffer layer deposition with a rinse solution after the buffer layer deposition step.

Moreover, it is also acceptable that the rinse solution is pure water.

Further, it is also acceptable that, in the first or second rinse step, air or a nitrogen gas is bubbled in the rinse solution.

Still further, it is also acceptable that the method includes: a second rinse step of rinsing the substrate surface with a rinse solution.

Furthermore, it is also acceptable that the method includes: a step of removing the colloidal solid matter from the used rinse solution used in the first or second rinse step through a filter, followed by re-use as a rinse solution.

Whereas, it is also acceptable that the method includes: a step of filtrating the rinse solution used in the first or second rinse step, and discharged as liquid waste through a filter, wherein the filtrated rinse solution is used as pure water for preparation of a chemical liquid for growing the buffer layer.

Further, it is also acceptable that the method includes: a step of performing draining/drying after the first or second rinse step.

Still further, it is also acceptable that the CIS-based thin-film solar cell device includes an alkali barrier layer formed between the substrate and the metal back electrode layer.

Furthermore, it is also acceptable that the p-type CIS-based light absorbing layer includes a p-type semiconductor such as copper indium/gallium diselenide ($CuInGaSe_2$) having a multinary compound semiconductor thin film, in particular, I-III-$VI_2$ group chalcopyrite semiconductor including, for example, copper indium diselenide ($CuInSe_2$), copper indium-gallium diselenide ($CuInGaSe_2$), copper gallium diselenide ($CuGaSe_2$), copper indium-gallium diselenide-sulfide ($Cu(InGa)(SSe)_2$), copper indium disulfide ($CuInS_2$), copper gallium disulfide ($CuGaS_2$), copper indium-gallium disulfide ($CuInGaS_2$), or a thin film of copper indium-gallium diselenide-sulfide ($Cu(InGa)(SSe)_2$) as the surface layer.

Furthermore, it is also acceptable that the buffer layer is a zinc mixed crystal compound semiconductor thin film, and includes any one or a combination of $ZnO$, $ZnS$, and $Zn(OH)_2$.

Whereas, it is also acceptable that, in the buffer layer deposition step, with a chemical bath deposition method in which aqueous ammonia, a zinc source (e.g., zinc salt such as zinc sulfate or zinc acetate), and a sulfur source (sulfur-containing salt such as thiourea) are dissolved in pure water to prepare a prescribed high resistance buffer layer growth solution, the buffer layer growth tank is held at a solution temperature of 70 to 90° C. (desirably, 80° C.), thereby to deposit the buffer layer.

ADVANTAGE OF THE INVENTION

In accordance with the present invention, by removing deposits deposited on the surface of the CIS-based light absorbing layer, the buffer layer is prevented from being unable to cover the low-resistance semimetal phase on the light absorbing layer surface, and the transparency and high resistance of the buffer layer-covered part can be held. As a result, it is possible to improve FF (fill-factor) and $E_{ff}$ (conversion efficiency) which are solar cell characteristics of the CIS-based thin-film solar cell device.

Further, in addition, by removing colloidal solid matter deposited on the buffer layer surface, the transparency and high resistance of the buffer layer-covered part are held further effectively.

Still further, in accordance with the invention, by reusing the cleaning solution for use in the cleaning step of removing the deposits, it is possible to reduce manufacturing cost of the device.

BEST MODE FOR CARRYING OUT THE INVENTION

A CIS-based thin-film solar cell device 3 manufactured by a method for manufacturing a CIS-based thin-film solar cell device in accordance with an embodiment of the present invention is, as shown in the basic structure of FIG. 1, a pn heterojunction device of a substrate structure in which high quality thin film layers are successively stacked in the order of a substrate 3A including soda-lime glass or the like, thereon, an alkali barrier layer 3B (which can be optional), a metal back electrode layer (generally, Mo) 3C, a p-type CIS-based light absorbing layer 3D, an n-type high resistance buffer layer 3E including a transparent and high resistance ultrathin film, and an n-type window layer (a transparent conductive film) 3F which has an opposite conductivity type from that of the p-type CIS-based light absorbing layer 3D, has a wide band gap, and is transparent, and has a conductivity.

Incidentally, the p-type CIS-based light absorbing layer 3D includes a p-type semiconductor such as copper indium/gallium diselenide ($CuInGaSe_2$) having a multinary compound semiconductor thin film, in particular, a I-III-$VI_2$ group chalcopyrite semiconductor including, for example, copper indium diselenide ($CuInSe_2$), copper indium-gallium diselenide ($CuInGaSe_2$), copper gallium diselenide ($CuGaSe_2$), copper indium-gallium diselenide-sulfide ($Cu(InGa)(SSe)_2$), copper indium disulfide ($CuInS_2$), copper gallium disulfide ($CuGaS_2$), copper indium-gallium disulfide ($CuInGaS_2$), or a thin film of copper indium-gallium diselenide-sulfide ($Cu(InGa)(SSe)_2$) as the surface layer.

Further, the n-type high resistance buffer layer 3E is a zinc mixed crystal compound semiconductor thin film, and includes any one of $ZnO$, $ZnS$, and $Zn(OH)_2$, or a combination thereof.

Below, a description will be given to the method for manufacturing a CIS-based thin-film solar cell device in accordance with an embodiment of the invention.

A series of manufacturing steps of a CIS-based thin-film solar cell device using the method for manufacturing a CIS-based thin-film solar cell device in accordance with this embodiment include, as shown in FIG. 2, a deposition step P1 of the alkali barrier layer 3B, a deposition step P2 of the metal back electrode layer 3C, a deposition step P3 of the p-type CIS-based light absorbing layer 3D, a pre-rinse step P4 of cleaning and removing deposits deposited on the p-type light absorbing layer 3D surface, a buffer layer deposition step P5 of performing deposition of the n-type high resistance buffer layer 3E, a rinse step P6 of cleaning and removing colloidal solid matter on the n-type high resistance buffer layer 3E surface, a dry step P7 of performing draining/drying of the device after the rinse step P6, and a deposition step P8 of the n-type window layer 3E The pre-rinse step P4 is to clean and remove deposits on the p-type CIS-based light absorbing layer 3D surface in a pre-rinse tank A.

The pre-rinse step P4 includes a step of cleaning the substrate surface and removing the deposits deposited on the surface of the p-type light absorbing layer 3D in the deposition step of the p-type light absorbing layer 3D with a pre-rinse solution in a first pre-rinse tank A1, and a step of filtrating the pre-rinse solution used for the cleaning through a filter, and thereby removing the deposits in the solution, then, circulating and leading this into a second pre-rinse tank A2, and rinsing the surface of the substrate including the light absorbing layer deposited thereon in the pre-rinse tank A2. Incidentally, the pre-rinse solution or the pre-rinse tanks A1 and A2 are heated to about 60 to 85° C. which is generally the same as the temperature of the buffer layer growth tank so as not to cause a difference in temperature from the buffer layer growth tank for use.

The deposits have been deposited upon deposition of the p-type CIS-based light absorbing layer 3D, and includes a simple substance, a compound, or a mixture of sulfur or selenium.

The pre-rinse solution is preferably pure water. However, aqueous ammonia or a lower amine solution can also be used.

Incidentally, in cleaning with the pre-rinse solution, it is possible to enhance the cleaning effect by bubbling air or a nitrogen gas into the pre-rinse solution.

Whereas, the pre-rinse solution used in the pre-rinse step P4, and discharged from the pre-rinse tanks A1 and A2 can also be re-used in the following manner: the pre-rinse solution is filtrated through a filter, so that the deposits in the solution are removed; then, this is circulated, and is led into the pre-rinse tanks A1 and A2.

In the deposition step P5 of the buffer layer 3E after the pre-rinse step P4, with a chemical bath deposition method in which aqueous ammonia, a zinc source (e.g., a zinc salt such as zinc sulfate or zinc acetate), and a sulfur source (a sulfur-containing salt such as thiourea) are dissolved in pure water to prepare a prescribed high resistance buffer layer growth solution, the buffer layer growth tank B is held at a solution temperature of about 70 to 90° C. (desirably 80° C.), thereby to deposit the n-type high resistance buffer layer 3E.

At this step, there is no difference in temperature between the pre-rinse tank A and the buffer layer growth tank B. Therefore, the temperature of the buffer layer growth tank B becomes stable, which facilitates temperature control.

After the buffer layer deposition step P5, the surface of the n-type high resistance buffer layer 3E is cleaned by the rinse step P6.

The rinse step P6 includes a step of cleaning the substrate surface and removing colloidal solid matter deposited on the surface of the n-type high resistance buffer layer 3E in the buffer layer deposition step P5 with a rinse solution in a first rinse tank C1, and a step of filtrating the rinse solution used for the cleaning through a filter, and thereby removing the colloidal solid matter in the solution, then, circulating and leading this into a second rinse tank C2, and rinsing the surface of the substrate including the buffer layer 3E deposited thereon in the rinse tank C2.

As the rinse solution, pure water is preferably used.

Incidentally, in cleaning with the rinse solution, it is possible to enhance the cleaning effect by bubbling air or a nitrogen gas in the rinse solution.

Whereas, the rinse solution used in the rinse step P6, and discharged from the rinse tanks C1 and C2 can also be re-used in the following manner: the rinse solution is filtrated through a filter, so that the colloidal solid matter in the solution is removed; then, this is circulated, and is led into the rinse tanks C1 and C2.

After the rinse step P6, draining/drying of the buffer layer 3E surface are carried out by the dry step P7.

Draining/drying in the dry step P7 can be carried out by, for example, dry air knife.

After drying by the dry step P7, in the n-type window layer deposition step P8, the n-type window layer 3F will be deposited by a sputtering method, an MOCVD method, or the like. However, the substrate 3A is placed on a hot plate set at a prescribed temperature for deposition to perform deposition in a heated state. This eliminates the necessity of additionally providing heating/drying steps.

The pre-rinse solution and the rinse solution discharged as liquid wastes from the pre-rinse tank A and the rinse tank C are filtrated through a filter to be re-used as pure water for preparation of a chemical liquid of the buffer layer growth tank B. This can largely reduces the amount of waste liquids formed upon liquid waste treatment, which contributes to reduction of manufacturing cost.

Incidentally, in the case of transfer between respective tanks, namely, transfer from the pre-rinse tank A to the buffer layer growth tank B, transfer from the buffer layer growth tank B to the rinse tank C, particularly, transfer from the buffer layer growth tank B using a heated solution to the ordinary-temperature rinse tank C, the film-deposited substrate 3A is placed in a covered holder to be transferred. Therefore, drying before the pre-rinse step P4 and the rinse step P6 of the substrate 3A can be prevented. This can prevent the formation of a white striped pattern from being formed on the substrate 3A surface, which can largely contribute to reduction of occurrence of defective appearance.

With the manufacturing method (the pre-rinse step P4, the buffer layer deposition step P5, the rinse step P6, the dry step P7) in accordance with this embodiment, the n-type high resistance buffer layer 3E is prevented from being unable to cover the low resistance semimetal phase on the p-type CIS-based light absorbing layer 3D surface due to deposits deposited on the surface of the p-type CIS-based light absorbing layer 3D. FIG. 3 shows the comparison between FF (fill-factor) 1 of the CIS-based thin-film solar cell device 3 having the n-type high resistance buffer layer 3E-covered part thus holding transparency and high resistance and FF 2 of a conventional CIS-based thin-film solar cell device 3' having a buffer layer-covered part which tends to undergo short-circuit because the buffer layer cannot cover the low resistance semi-metal phase on the light absorbing layer surface.

It has been indicated as follows: as for FF 1 of the CIS-based thin-film solar cell device 3 manufactured according to this embodiment, the FF is more improved than FF 2 of the conventional CIS-based thin-film solar cell device 3', in the case where the judgment criterion value of FF is assumed to be 0.6, when the same solution is repeatedly used in the buffer layer growth tank B, and the number of repetitions is 8 or less. Then, in general, there is the relationship as the following equation (1) in the standard test condition (STC) of temperature of 25° C., solar irradiance of 1000 W/m², and air mass of 1.5 between $E_{ff}$ (conversion efficiency) (%) and FF.

$$E_{ff}[\%]=V_{OC}[V] \times I_{SC}[A] \times FF/(\text{aperture area}) [m^2] \times 1000 [W/m^2]) \quad (1)$$

Incidentally, $V_{OC}$ is the open-circuit voltage (open-circuit voltage per cell for the integrated type), and $I_{SC}$ is the short-circuit current [A].

Therefore, from the measurement results of FF of FIG. 3, it has been indicated that the CIS-based thin-film solar cell device 3 manufactured according to this embodiment is more improved in FF than the conventional CIS-based thin-film solar cell device 3'. From the foregoing equation (1), $E_{ff}[\%]$ is directly proportional to FF, and hence $E_{FF}$ [%] is also improved.

DESCRIPTION OF REFERENCE NUMERALS AND SIGNS

Figure 1:
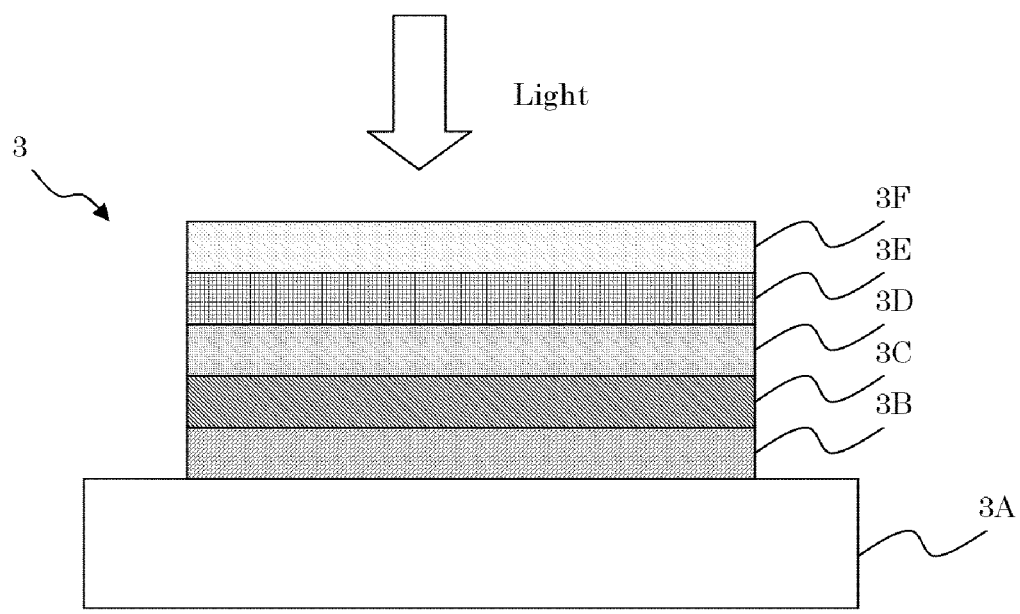
[FIG. 1] A schematic view showing a configuration of a CIS-based thin-film solar cell device manufactured with a method for manufacturing a CIS-based thin-film solar cell device in accordance with an embodiment of the present invention.
Figure 2:
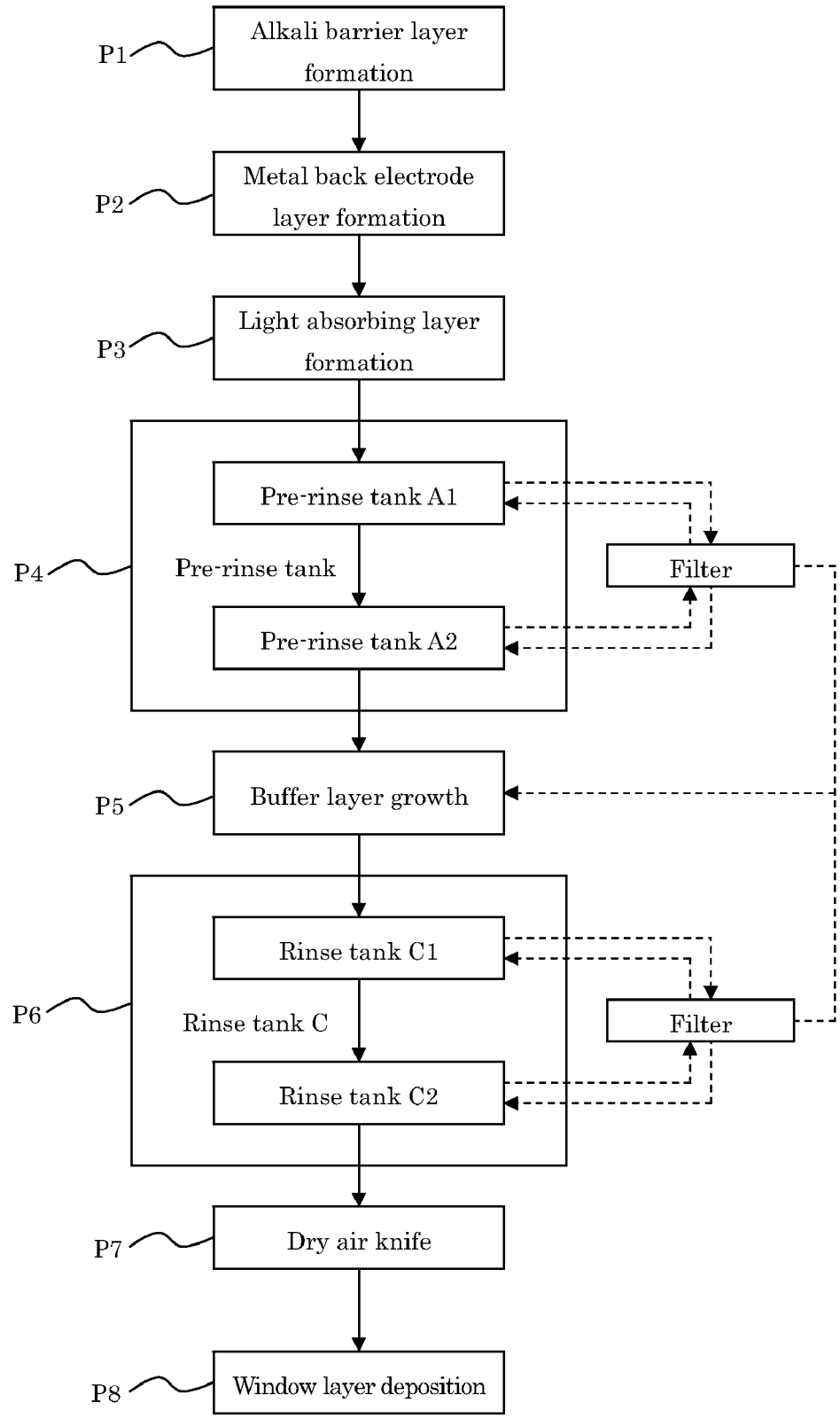
[FIG. 2] A schematic view showing a series of flow of the manufacturing steps using the method for manufacturing a CIS-based thin-film solar cell device in accordance with the present embodiment.
Figure 3:
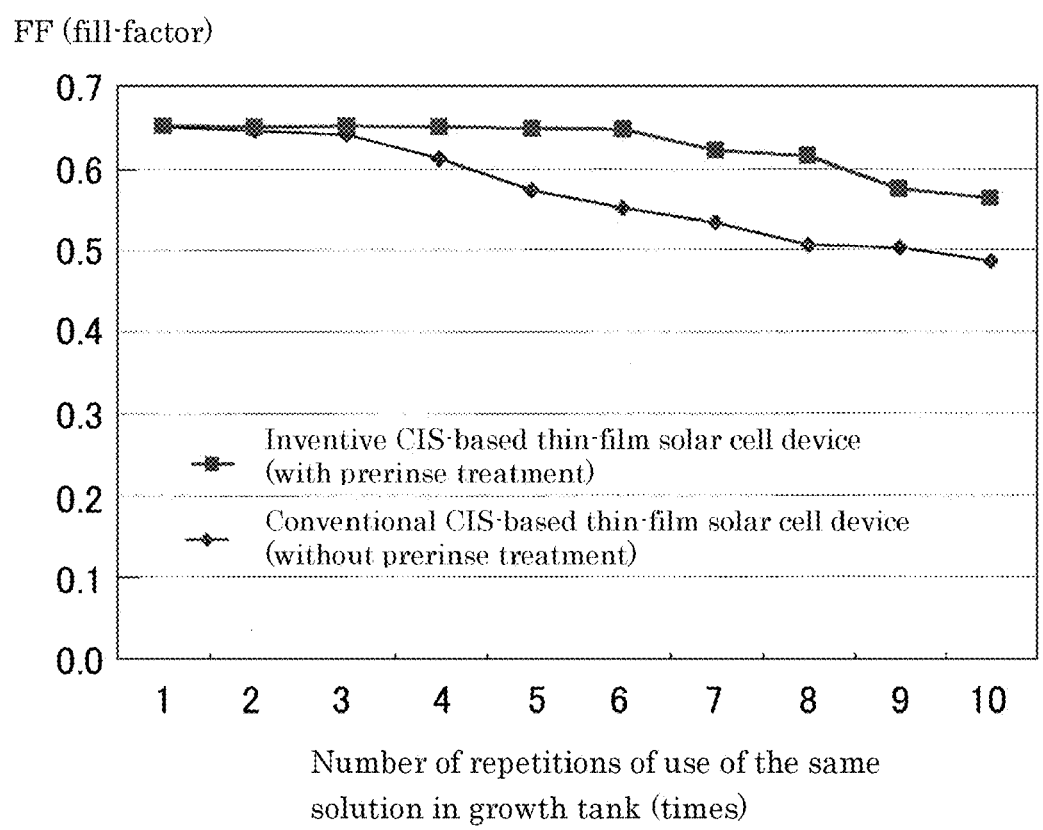
[FIG. 3] A view of comparison between FF1 of a CIS-based thin-film solar cell device 3 manufactured with the method for manufacturing a CIS-based thin-film solar cell device in accordance with the present embodiment and FF2 of a CIS-based thin-film solar cell device manufactured with a conventional manufacturing method.

3 CIS-based thin-film solar cell device
3A Substrate
3B Alkali barrier layer
3C Metal back electrode layer
3D P-type CIS-based light absorbing layer
3E N-type high resistance buffer layer
3F N-type window layer (transparent conductive film)
P1 Alkali barrier layer deposition step
P2 Metal back electrode layer deposition step
P3 P-type light absorbing layer deposition step
P4 Pre-rinse step
P5 Buffer layer deposition step
P6 Rinse step
P7 Dry step
P8 N-type window layer deposition step
A1 First pre-rinse tank
A2 Second pre-rinse tank
B Buffer layer growth tank
C Rinse tank
C1 First rinse tank
C2 Second rinse tank

The invention claimed is:

1. A method for manufacturing a CIS-based thin-film solar cell device having a pn heterojunction of a substrate structure comprising:
providing
a substrate,
a metal back electrode layer stacked on the substrate, and
a CIS-based light absorbing layer having a p-type conductivity type stacked on the metal back electrode layer;
providing a pre-rinse solution, wherein the pre-rinse solution includes one of pure water, aqueous solution, and lower amine solution, and heating the pre-rinse solution to a temperature substantially equal to a temperature of buffer layer growth tank;
removing with the pre-rinse solution deposits deposited on a surface of the CIS-based light absorbing layer;
depositing an n-type buffer layer on the surface of the CIS-based light absorbing layer subsequent to the removing with the pre-rinse solution; and
depositing an n-type window layer on the n-type buffer layer, wherein the n-type window layer has an opposite conductivity type from that of the CIS-based light absorbing layer, and has a conductivity.

2. The method for manufacturing a CIS-based thin-film solar cell device according to claim 1, wherein the removing with the pre-rinse solution includes bubbling one of air and nitrogen gas into the pre-rinse solution.

3. The method for manufacturing a CIS-based thin-film solar cell device according to claim 1, further comprising:
repeating the removing with the pre-rinse solution.

4. The method for manufacturing a CIS-based thin-film solar cell device according to claim 3, further comprising:
removing through a filter the deposits from the pre-rinse solution used in the removing with the pre-rinse solution; and
re-using the pre-rinse solution obtained from the removing through the filter.

5. The method for manufacturing a CIS-based thin-film solar cell device according to claim 3, further comprising:
discharging as liquid waste the pre-rinse solution used in the removing with the pre-rinse solution;
filtrating through a filter the pre-rinse solution obtained from the discharging as liquid waste; and
using pure water for preparation of a chemical liquid for growing the buffer layer the pre-rinse solution obtained from the filtrating through the filter.

6. The method for manufacturing a CIS-based thin-film solar cell device according to claim 1, further comprising:
removing with a rinse solution colloidal solid matter formed and deposited on a surface of the n-type buffer layer during the depositing the n-type buffer layer.

7. The method for manufacturing a CIS-based thin-film solar cell device according to claim 6,
wherein the rinse solution is pure water.

8. The method for manufacturing a CIS-based thin-film solar cell device according to claim 6, further comprising:
repeating the removing with the rinse solution.

9. The method for manufacturing a CIS-based thin-film solar cell device according to claim 8, further comprising:
removing through a filter the colloidal solid matter from the rinse solution used in the removing with the rinse solution; and
re-using the rinse solution obtained from the removing through the filter.

10. The method for manufacturing a CIS-based thin-film solar cell device according to claim 8, further comprising:
discharging as liquid waste the rinse solution used in the removing with the rinse solution; and
filtrating through a filter the rinse solution obtained from the discharging as liquid waste,
using pure water for preparation of a chemical liquid for growing the buffer layer the rinse solution obtained from the filtrating through the filter.

11. The method for manufacturing a CIS-based thin-film solar cell device according to claim 6, comprising:
performing at least one of draining and drying after the removing with the rinse solution.

12. The method for manufacturing a CIS-based thin-film solar cell device according to claim 1, wherein the depositing the n-type buffer layer includes:
providing a buffer layer growth tank;
providing a prescribed high resistance buffer layer growth solution including aqueous ammonia, a zinc source, and a sulfur source dissolved in pure water;
placing the prescribed high resistance buffer layer growth solution in the buffer growth tank; and
holding the buffer layer growth tank at a solution temperature of 70° C. to 90° C.

13. The method for manufacturing a CIS-based thin-film solar cell device according to claim 4, comprising:
repeating the removing through the filter subsequent to repeating the removing with the pre-rinse solution; and
re-using the pre-rinse solution obtained from the repeating the removing through the filter.

14. The method for manufacturing a CIS-based thin-film solar cell device according to claim 5, further comprising:
repeating the discharging as liquid waste subsequent to the repeating the removing with a pre-rinse solution;
repeating the filtrating through the filter subsequent to the repeating the discharging as liquid waste,
repeating the using the pure water subsequent to the repeating the filtrating through the filter.

15. The method for manufacturing a CIS-based thin-film solar cell device according to claim 6,
wherein the removing with the rinse solution includes bubbling one of air and nitrogen gas into the rinse solution.

16. The method for manufacturing a CIS-based thin-film solar cell device according to claim 8,
wherein the repeating the removing with the rinse solution includes bubbling of air and nitrogen gas into the rinse solution.

17. The method for manufacturing a CIS-based thin-film solar cell device according to claim 9, further comprising:
repeating the removing through the filter subsequent to the repeating the removing with the rinse solution; and
re-using the rinse solution obtained from the repeating the removing through the filter.

18. The method for manufacturing a CIS-based thin-film solar cell device according to claim 10, comprising:
repeating the discharging as liquid waste subsequent to the repeating the removing with the rinse solution;
repeating the filtrating through the filter subsequent to the repeating the discharging as liquid waste,
repeating the using the pure water subsequent to the repeating the filtrating through the filter.

19. The method for manufacturing a CIS-based thin-film solar cell device according to claim 6,
wherein the depositing the n-type buffer layer deposition includes:
providing a buffer layer growth tank;
providing a prescribed high resistance buffer layer growth solution including aqueous ammonia, a zinc source, and a sulfur source dissolved in pure water;
placing the prescribed high resistance buffer layer growth solution in the buffer growth tank; and
holding the buffer layer growth tank at a solution temperature of 70° C. to 90° C.

20. The method for manufacturing a CIS-based thin-film solar cell device according to claim 1, further comprising:
removing with a rinse solution colloidal solid matter formed and deposited on a surface of the n-type buffer layer during the depositing the n-type buffer layer;
wherein the removing with the rinse solution precedes the depositing the n-type window layer.

* * * * *